United States Patent [19]

Wu et al.

[11] Patent Number: 4,595,837
[45] Date of Patent: Jun. 17, 1986

[54] METHOD FOR PREVENTING ARCING IN A DEVICE DURING ION-IMPLANTATION

[75] Inventors: Chung P. Wu, Hamilton Township, Mercer County; Frank Kolondra, Delaware Township, Hunterdon County, both of N.J.

[73] Assignee: RCA Corporation, Princeton, N.J.

[21] Appl. No.: 775,942

[22] Filed: Sep. 12, 1985

Related U.S. Application Data

[63] Continuation of Ser. No. 532,897, Sep. 16, 1983.

[51] Int. Cl.⁴ .......................................... H01J 37/317
[52] U.S. Cl. .................................. 250/492.2; 250/398
[58] Field of Search ............. 250/492.1, 492.2, 492.21, 250/492.3, 398, 397

[56] References Cited

U.S. PATENT DOCUMENTS

| | | | |
|---|---|---|---|
| 3,507,709 | 4/1970 | Bower | 250/492.2 |
| 3,908,183 | 9/1975 | Ennis, Jr. | 357/65 |
| 4,011,499 | 3/1977 | Ko et al. | |
| 4,118,630 | 10/1978 | McKenna et al. | 250/492.2 |
| 4,135,097 | 1/1979 | Forneris et al. | 250/492.2 |
| 4,283,631 | 8/1981 | Turner | 250/492 B |
| 4,361,762 | 11/1982 | Douglas | 250/492.2 |
| 4,383,180 | 5/1983 | Turner | 250/492.2 |

OTHER PUBLICATIONS

Wu et al., RCA Review, vol. 44, Mar. 1983.
Varian Manual of DF-3000 Ion Implanter, Varian/Extrion Division Gloucester, MA.

Primary Examiner—Bruce C. Anderson
Assistant Examiner—Paul A. Guss
Attorney, Agent, or Firm—Birgit E. Morris; Donald S. Cohen

[57] ABSTRACT

There is disclosed herein an ion implantation apparatus providing for electron flooding during ion implantation to not only neutralize the positive space-charge on an ion beam but also provide a slightly negative space-charge on the beam whereby accumulated positive charges on an insulated device is obviated and only harmless negative charges remain.

7 Claims, 7 Drawing Figures

METHOD FOR PREVENTING ARCING IN A DEVICE DURING ION-IMPLANTATION

This is a continuation of application Ser. No. 532,897 filed Sept. 16, 1983.

This invention relates to ion implantation and particularly to a method for providing a space-charge neutralized ion beam during ion implantation to prevent electrical arcing on the implanted device.

BACKGROUND OF THE INVENTION

The irradiation of metals and semiconductor materials by ion beams provides a means for effecting the doping of such materials in a controlled and rapid manner. Ion implantation, as the process is known, is accomplished by irradiating a semiconductor wafer, for example, with an ion beam of controlled intensity for such integrated exposure providing the desired dopant or impurity concentration. See U.S. Pat. Nos. 4,283,631 and 4,383,180 issued to N. Turner for descriptions of typical ion implantation apparatus.

With the demand of ever increasing sizes of wafers for implantation, higher current levels of ion beams are needed. With such current level ion beams a rapid build-up of positive charge on the target surface can result if the target is nonconducting, that is, a target that is formed essentially of dielectric material typical in semiconductor devices. The positive charge build-up can be so rapid and so large as to lead to electrical arc discharges that can cause physical damage to the devices and the circuits that are on the wafer. The problem of reducing if not eliminating electrical arc discharge due to large accumulation of charge subsequent to the ion implantation process is knwon to be handled by conventional electron flood systems in the target chamber to neutralize the ion beam during the time the ions are being implanted. Some systems provide for neutralization by an electron flood current that is as high as ten times the scanned ion beam current. However, it appears that even these currents that are ten times the ion current are inadequate since damage due to electrical arcing may be reduced by such high currents but not eliminated.

There is a need in the art to eliminate electrical arcing due to charge build-up during ion implantation.

SUMMARY OF THE INVENTION

The invention comprises a method for preventing arcing in devices during ion implantation by ion-implanter apparatus having a Faraday cage by irradiating an insulated target device with a beam of selected ions, measuring the current of the beam to determine the ion dose on the device, and flooding the ion beam in the Faraday cage with an electron flood emission current having a value greater than the value needed to neutralize the space-charge of the ion beam. The electron flooding of the device during implantation results in developing a negative charge on the device with small non-arcing negative voltages on the order of $-5$ to $-10$ volts.

DETAILED DESCRIPTION OF THE PREFERED EMBODIMENT OF THE INVENTION

Figure 1:
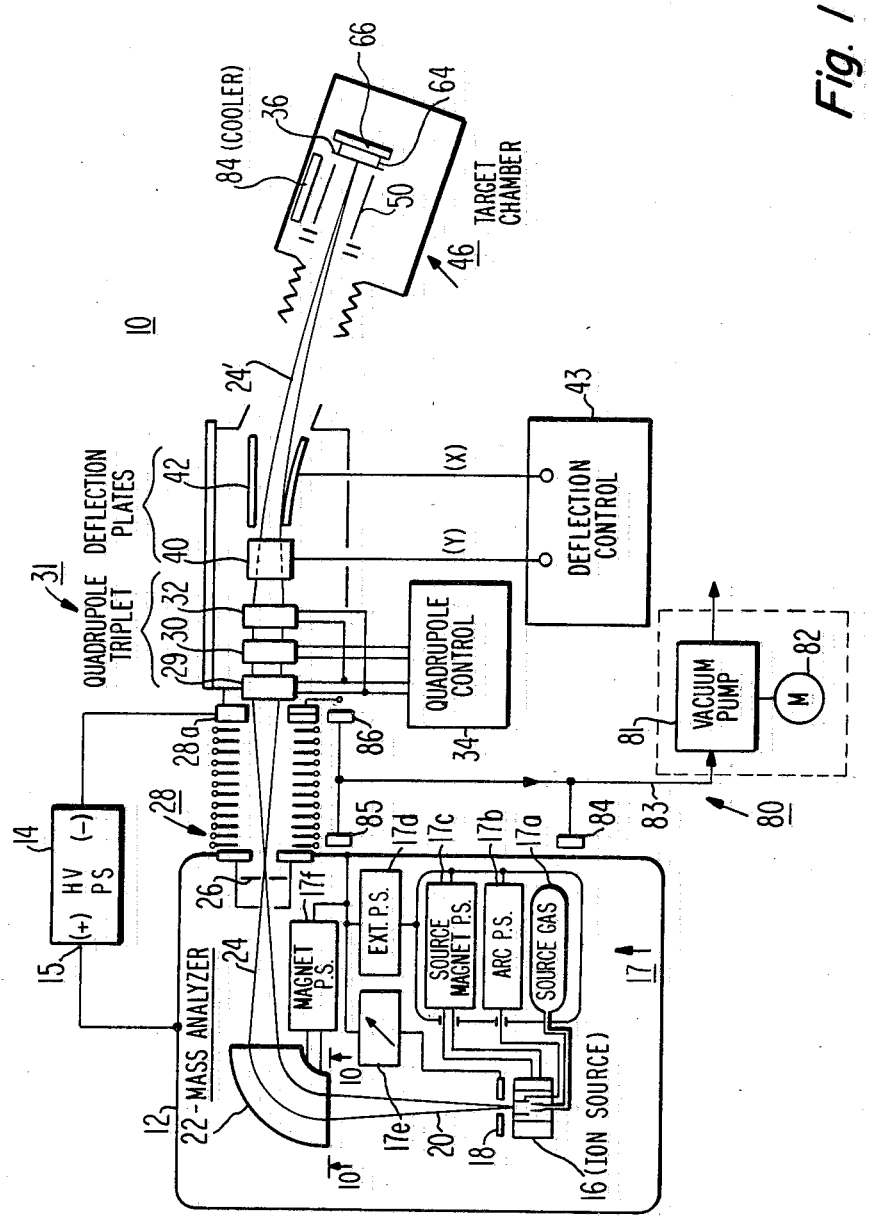
FIG. 1 is a schematic of a typical ion implantation system useful for practicing the present invention.

The present invention can be practiced in an ion implantation apparatus 10 of the type as shown in FIG. 1. The ion implantation apparatus 10 includes a high voltage terminal 12 maintained at a high positive potential relative to a reference potential, such as ground, by a high voltage power supply (HVPS) 14 via terminal 15. Supply 14 provides a selected voltage typically in the range of 0 to 280 keV. Terminal 12 includes structure to house the portion of the implantation apparatus 10 required to form a beam of ions of desired species. In practice, a gaseous feed stock of the desired species is employed such as from a source 16 to provide ions of various forms including singly- and doubly-charged ions of the desired specie. A typical ion source 16 will require a system supply 17 within the terminal housing 12 to maintain the ionized discharge, and to impose axial magnetic fields across the discharge region and an extraction supply cooperating with the electrode 18 to shape the electric field at the aperture of the source 16 for effective development of a well-defined high current ion beam 20. Thus, supply 17 will include a source gas 17a directed to ion source 16. Supply 17 further includes an arc power supply 17b to sustain an ionizing discharge, a power supply 17c to impose an axial magnetic field across the discharge region, and extraction and power supply 17d, and vernier 17e cooperative with the electrode 18 to shape the electric field at the aperture of the ion source 16 for effective control of a well defined high current ion beam 20.

The ion beam 20 diverging from the source 16 is momentum analyzed by an arcuate-shaped mass analyzer 22 to provide the desired ion beam 24. A magnet of analyzer 22 is energized by magnet power supply 17f. The analyzed ion beam 24 passes through the analyzer exit slit 26 and then to an accelerator tube 28 where it encounters a carefully designed field gradient from the high, relatively positive, voltage terminal 12 to a relatively negative or ground potential terminal 28a. An electrical optical device such as a conventional "quadrupole triplet" 31 comprising control elements 29, 30 and 32 under control of a quadrupole control 34 is operated to produce spatial-energy focus of the beam at a desired image plane. Two sets of electrostatic deflection plates 40 and 42 serve to direct the beam over the desired area of the image plane 36 in the target chamber 46. A suitable deflection control 43 is provided to control the deflection plates 40 and 42 arbitrarily labeled y and x, respectively.

Assuming the ion source 16 is arranged to provide gaseous phosphorus ions, the beam 20 will contain phosphorus ions that will be guided to the mass analyzer 22. The magnet of analyzer 22 is suitably provided with appropriate currents as known in the art to separate the particles in the beam 20 into the desired mass of the ion. The ions of phosphorus will traverse the arcuate path defined by the analyzer 22 and will exit as a beam to define the beam 24 of phosphorus ions. The analyzer 22 will separate from the beam 20 all particles that are not of the same mass and charge as the mass and charge of phosphorus.

The ion beam 24' can be arranged to provide for singly-charged phosphorus ions such as ($^{31}P+$). In the embodiment being described, ion beam 24', is provided with such singly-charged ions.

A conventional vacuum pumping apparatus 80, including a pump 81 and a meter 82, provides vacuum in the system by way of conduit 83 coupled to connectors 84, 85, 86, etc., suitably attached to selected portions of the apparatus 10.

Figure 2:
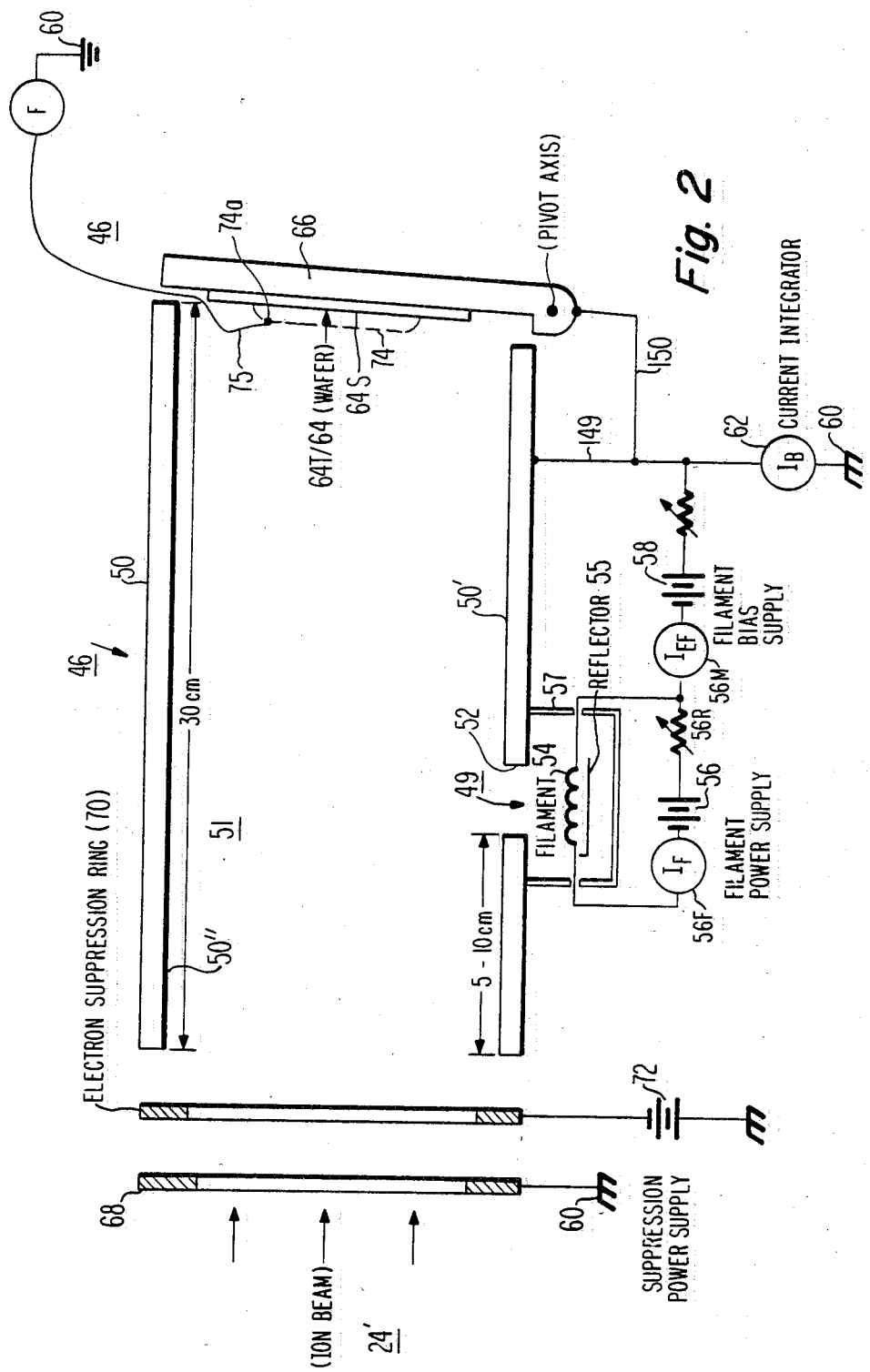
FIG. 2 is a schematic of the Faraday cage portion of the apparatus of FIG. 1 illustrating apparatus for providing a source of electron flood emission currents for flooding the ion beam.

Reference is made to FIG. 2 for a more detailed schematic of the target chamber 46 of FIG. 1, showing, in particular, means 49 providing electron flood emission current ($I_{EF}$) for neutralizing the space-charge of the ion beam 24'. The target chamber 46, typically rectangular in cross section, comprises a conventional Faraday cage 50 having an opening 52 of convenient shape, suitably a rectangle, in the wall 50' through which high energy electrons are emitted into the chamber 51 without a direct path to the target 64. The high energy electrons are derived from a tungsten filament 54 energized by a suitable filament power supply 56 conveniently shown as a battery, but is typically a.c. powered via a transformer, which, in turn, is biased by a battery power supply 58 with respect to cage 50 and to ground 60. Electrons emitted from the filament 54 are passed through the opening 52 and thence into the chamber 51 aided by means of a reflector 55 suitably positioned within a housing 57 for the filament 54.

The filament supply 56 is adjustable to a predetermined and fixed value by adjustable resistor 56R to provide the desired filament current ($I_F$) as measured by meter 56F.

The electron flood current ($I_{EF}$) which flows from the filament 54 as electrons into chamber 51 and strikes the cage walls 50' and 50" as well as secondary electrons which restrike the walls can return to the electron flood supply 49 via path 149. Flooding current ($I_{EF}$) which is captured by an ion beam 24' in the form of low energy secondary electrons from the walls, or high energy primary electrons directly from the filament 54, will be carried by the beam to the wafer 64 and eventually to the support platen 66 and thereby returned to the supply 49 via path 150.

The ion beam current ($I_B$) is measured by current integrator 62. The current ($I_B$) is measured only with the ion beam 24' operating.

The manner of determining what that predetermined flooding current ($I_{EF}$) value is, according to the present invention, will be described in further detail hereinafter, particularly with respect to the test wafer 64T shown in FIGS. 3 and 4.

In typical operation, after calibration, a conventional target 64, typically a wafer, is mounted on a platen support 66. In practice, the support 66 will include a conventional wafer carrier mechanism (not shown) for carrying and positioning in sequence a plurality of wafers 64 to and from the ion implant position plane 36 (FIG. 1). The ion beam 24' after it passes through the deflection plates 40 and 42, as shown in FIG. 1, is passed through a beam aperture ring 68 electrically connected to ground 60. An electron suppression ring 70 is spaced about 0.5 inch (1.25 cm) between, respectively, the ring 68 and the cage 50 and is negatively biased with a voltage of approximately −500 volts from battery supply 72. The ring 70, when energized, serves to suppress electrons which may pass rearwardly (upstream of beam 24') from the cage 50. The system of FIG. 1 providing an ion beam 24' to the Faraday cage 46 is otherwise operated in a conventional manner, as indicated above, and will not be described in detail herein.

In the operation of the electron flood means 49, high energy electrons are emitted and are accelerated at about 350 to 600 electron volts (eV) towards the wall 50" of the Faraday cage 50 producing secondary electrons which are scattered into chamber 51 with a mean energy of just a few electron volts. The tungsten filament 54 and plate reflector 55 are preferably biased at −350 V with respect to the Faraday cage 50 by battery 58. The ion beam 24' passing into the cage 50 traps the secondary electrons from wall 50" as needed to neutralize the effort of its own net charge, the balance of the unused secondary electrons striking the Faraday walls returning to the flood gun circuit 49 via path 149. Note that the ion beam 24' itself is not neutralized in this process. What is neutralized is the space-charge of the beam 24' to provide accordingly a space-charge neutral beam striking the target 64.

It should be understood that most of the low-energy secondary electrons trapped in the ion beam 24' do not in fact neutralize the ions of the ion beam to form neutral atoms. To the contrary, these low energy secondary electrons follow spiral paths of their own in a random manner and can travel in a rotational direction about the ion beam 24'. When the ion beam 24' carrying the secondary electrons strikes a dielectric, such as the surface 64S of a wafer 64, and produces a static charge on the dielectric, the trapped electrons in the beam 24' are immediately attracted to that static charge tending to neutralize the charge.

The electron gun means 49 is located near the ion beam entrance of the Faraday cage 50. Note that the opening 52 in the wall is arranged so that there is no direct line of sight between the tungsten filament 54 and the surface of the target 64. This arrangement insures that damage to the target, such as a semiconductor device 64, by high-energy electrons emitted from the flood means 49 is avoided. Moreover, direct contamination of the target from the electron gun 49 filament is also avoided.

The electron flood gun emission current ($I_{EF}$) as measured by meter 56M is adjustable by resistor 56R, for example, in the range of zero to 15 milliamperes. Conventional operation of the electron flood means 46 heretofore provided flood emission currents ($I_{EF}$) on the order of 10 times the ion beam current ($I_B$) in an attempt to neutralize the charge on the ion beam 24'. Our experiments show that such flood currents are too small to neutralize the accumulated charges.

It has been determined in certain devices, such as a wafer 64, where the insulated islands on a target are of sufficient size and well insulated, that charges of very large voltages can accumulate and damage the target surface 64S when the charge is discharged across potential gradients that may develop on the surface. We have discovered that to simply neutralize the charge of an ion beam by flood electrons of 10 times the current ($I_B$) of the ion beam does not solve the problem of high voltage accumulation charges on the surface of certain devices having a large percentage of dielectric surface, such as needed on silicon-on-sapphire (SOS) wafers. We have further discovered that electron flood emission currents ($I_{EF}$) are preferably greater than the current needed simply to neutralize the beam charge in order to obviate disastrous or catastrophic electrical charge accumulations on insulating surfaces. Moreover, we have discovered that "over-neutralization" of the beam in fact develops a negative charge on the surface but that this negative charge unexpectedly does not develop excessive deleterious voltages and consequent negative charges on the surface. The maximum negative voltage that can develop on a target surface due to the excessive filament current emission is no greater than 10–15 volts, which voltages are approximately the energy of the secondary electrons scattered from the walls of the Faraday cage. Thus, the overflooding of the ion beam 24' by excessive electrons is relatively safer than any "under-flooding" by electrons. These discoveries are based on experiments that were performed on the apparatus of FIGS. 1 and 2 as will now be explained.

We use the terms "over-neutralization" by "over-flooding" to indicate that we first determine and provide the current needed to neutralize the beam completely and then provide additional current to therefore "over-neutralize" the beam.

Figure 3:
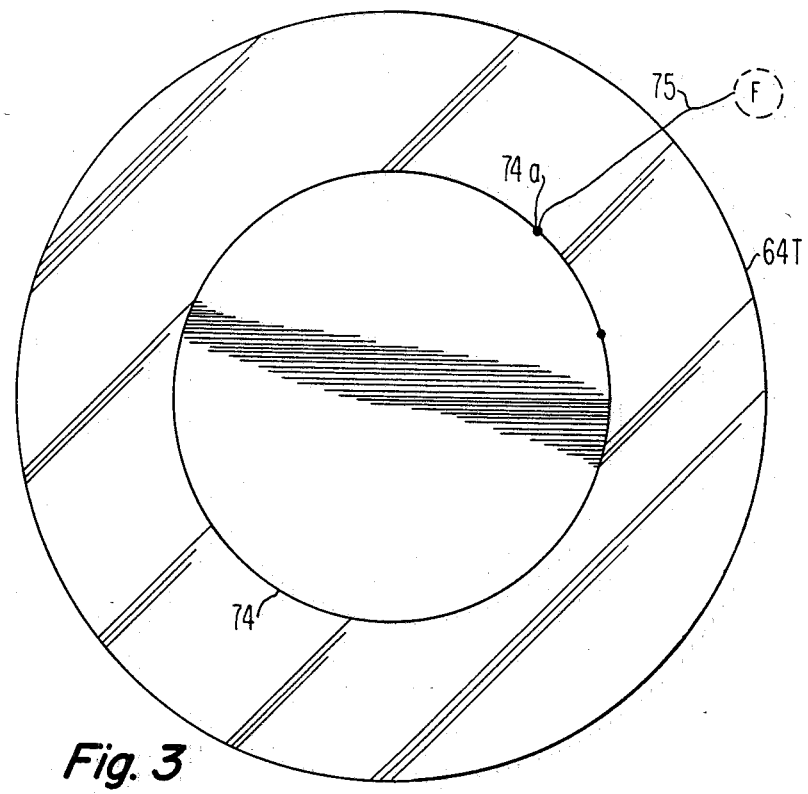
FIG. 3 is a diagram of an experimental arrangement of a wafer in plan view used in measuring the voltage on the device during ion-implantation of the device.
Figure 4:
FIG. 4 is a side view of FIG. 3.

Reference is made to FIGS. 3 and 4 illustrating a wafer 64T that is provided for the calibration test needed to determine the required currents with an extended electrode 74, such as aluminum foil, having a diameter of approximately half that of the 3-inch diameter wafer 64T and a thickness of about 0.005 to 0.010 inch. A conductor wire 75 connected to the electrode 74 at portion 74a is extended through the chamber 46 through a vacuum feedthrough passage and seal (not shown) to a differential voltmeter F, such as model 825A made by the Fluke Company. Meter F, connected to ground 60, measures the voltage developed on the target electrode 74 with respect to ground potential 60 during the time the electrode 74 and the wafer 64T are being implanted. Tests were done in sequence, first with, and subsequently without, the electron flood means 49 operating to flood and over-neutralize the beam 24' until a net negative space-charge existed on the beam. Electrode 74 is made sufficiently large to develop a voltage with respect to system ground 60 during implantation of the test wafer 64T. The test device 64T is thus a capacitor effective to collect a large charge during implantation. When the voltage (F) is zero, the ion beam space-charge is completely neutralized.

Many experiments performed with this test arrangement in which wafer 64T was used showed that the electron flood means 49 could in fact over-neutralize the positive charges from the ion beam resulting in the target 64T being charged negatively to about −10 volts. This negative charge effect heretofore has not been recognized. We have found there exists an optimum electron flood emission current for each combination of a target, the ion specie, energy and ion beam current at which the beam charging at the target 64 is neutralized without over-neutralization. The optimum flood emission current for our description is defined as the filament emission current ($I_{EF}$) at which complete neutralization of the beam charging is achieved. Furthermore, it was observed from our experiments that the optimum emission current ($I_{EF}$) was also a function of ion beam tuning and the geometry of the Faraday cage 50. A highly diffused ion beam 24', that is, one which becomes detuned, requires less than 1/5 of the electron flood emission current ($I_{EF}$) needed for complete target neutralization as compared to a tight and well-tuned ion beam. Data was recorded only after proper ion beam tuning was achieved under each of the conditions as set forth above.

Figure 5:
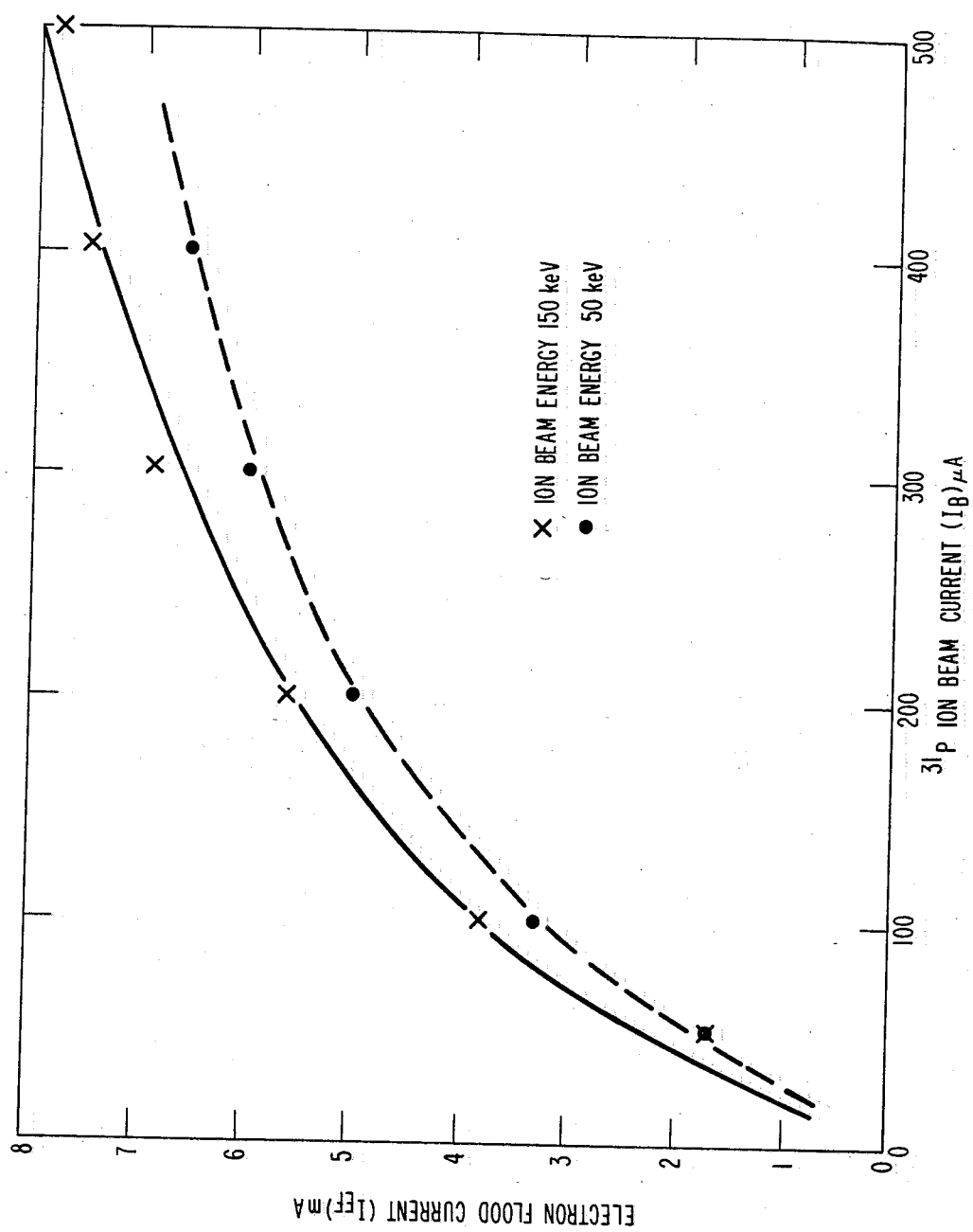
FIG. 5 shows curve plots of electron filament emission current ($I_{EF}$) for neutralizing the charge of an ion beam as a function of the ion beam current ($I_B$) for ions of phosphorous ($^{31}P+$) at different energies.

Reference is made to FIG. 5 which shows the electron field emission current ($I_{EF}$) for complete charge neutralization of a target wafer 64 charged by two separate phosphorus ion beams, i.e. $^{31}P$ ion beams at 50 keV and at 150 keV, respectively, as a function of the scanned ion beam current ($I_B$). The data for these curves was obtained with the low biased mode (−350 V) on the electron flood means 49 with the power supply 58 set at −350 volts with respect to the cage 50. The high biased mode (i.e. with a voltage of −600 V) was found to be disastrous unless the suppression ring 70 at the entrance of the Faraday cage 50 is biased with a voltage 72 at greater than −600 V instead of the typical −500 V. By this increased biasing, the escape of electrons from the cage rearwardly, i.e. upstream of the beam, was avoided. It can be seen from FIG. 5 that for beam current values below $I_B \sim 100$ μA, the emission $I_{EF}$ is a linear function of an ion beam current, and above $I_B$ approximating 200 μA, $I_{EF}$ starts to show saturation effects.

An examination of the data shown in FIG. 5 shows that a flooding current ($I_{EF}$) of 30 to 40 times the ion beam current ($I_B$) at 100 microamperes is needed to completely neutralize the positive space-charge of the phosphorus ion beam 24'. However, at higher beam currents of, for example, 400 microamperes, the flooding current ($I_{EF}$) need by only 16 times the beam current ($I_B$). With this data, one can provide 10 to 20% additional flood current ($I_{EF}$) to achieve the desired effect of a slight negative charge on the device. Heretofore as mentioned above, flood currents of ten times the beam current were believed adequate to neutralize the beam. Our experiments have shown these values to be inadequate to surely prevent arcing.

Attempts to obtain data for high beam currents ($I_B$) for certain specie of ion beams may fail for two reasons. First, in the presence of approximately 6 mA of electron flood current the ion beam may not stay tuned. Second, the entire Faraday assembly 46 may get so hot from the heat radiated from the electron gun tungsten filament 54 that the target wafer 64 clamped to the holder 66 may crack due to the excessive temperature difference between the two major surfaces of the wafer 64. This would indicate that the entire Faraday assembly 46 must be cooled for operation of the system when the electron flood mode was being used with large currents above 6 mA for boron beams, for example. Moreover, if it is not cooled there is a high likelihood of target contamination from the heated Faraday assembly. Accordingly, a cooling means 84 (shown in FIG. 1) is utilized to cool the Faraday cage 50. A suitable means for cooling a Faraday cage is disclosed in more detail in U.S. Pat. No. 4,135,097 issued on Jan. 16, 1979 to J. L. Forneris et al.

Figure 6:
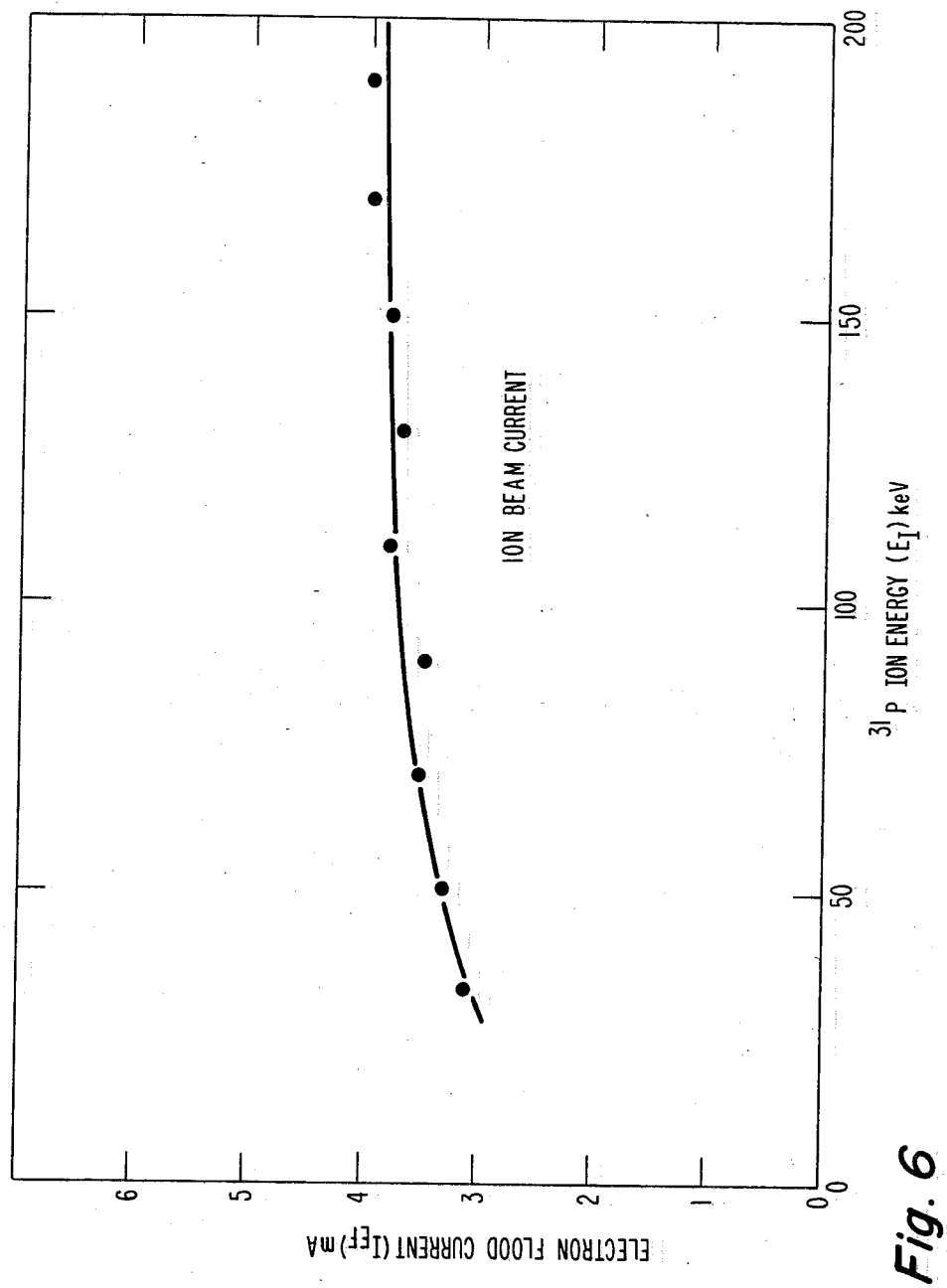
FIG. 6 is a curve plot of electron filament emission current ($I_{EF}$) of FIG. 5 as a function of ion energy ($E_I$) in the ion beam of phosphorus ($^{31}P+$) at a constant beam current ($I_B$)

The dependence of the emission of flood current ($I_{EF}$) and ion energy ($E_I$) is clear from the data shown by the curve of FIG. 6. This dependency was investigated at a constant beam current ($I_B$) of 100 μA. FIG. 6, thus, shows the electron emission current ($I_{EF}$) required for complete neutralization of a target as a function of the ion energies ($E_I$). For $^{31}P$ ions below 50 keV, the emission current $I_{EF}$ has a strong dependence o ion energy $E_I$, the kinetic energy of the impinging ion. At energies above 100 keV the flood current $I_{EF}$ has only a weak dependence of ion energy $E_I$. This is in qualitative agreement with the experimental ion-induced secondary electron field coefficient $\gamma$ from the electrode 74 (formed of aluminum) when bombarded by ions, which value of $\gamma$ increases rather steeply for ion energies below 50 keV. It is clear that for higher values of the coeffecient $\gamma$, more flooding electrons are needed for charge neutralization of the target surface.

An experiment was also performed to investigate the effects of the test target electrode (74) material on wafer 64T on the optimum electron flood emission current $I_{EF}$. A similar test target with a silver electrode instead of aluminum (74, FIGS. 3 and 4) was used for the experiment. The results of this experiment are shown in FIG. 7 which shows the plot of emission current ($I_{EF}$) versus beam current ($I_B$) at 150 keV.

Figure 7:
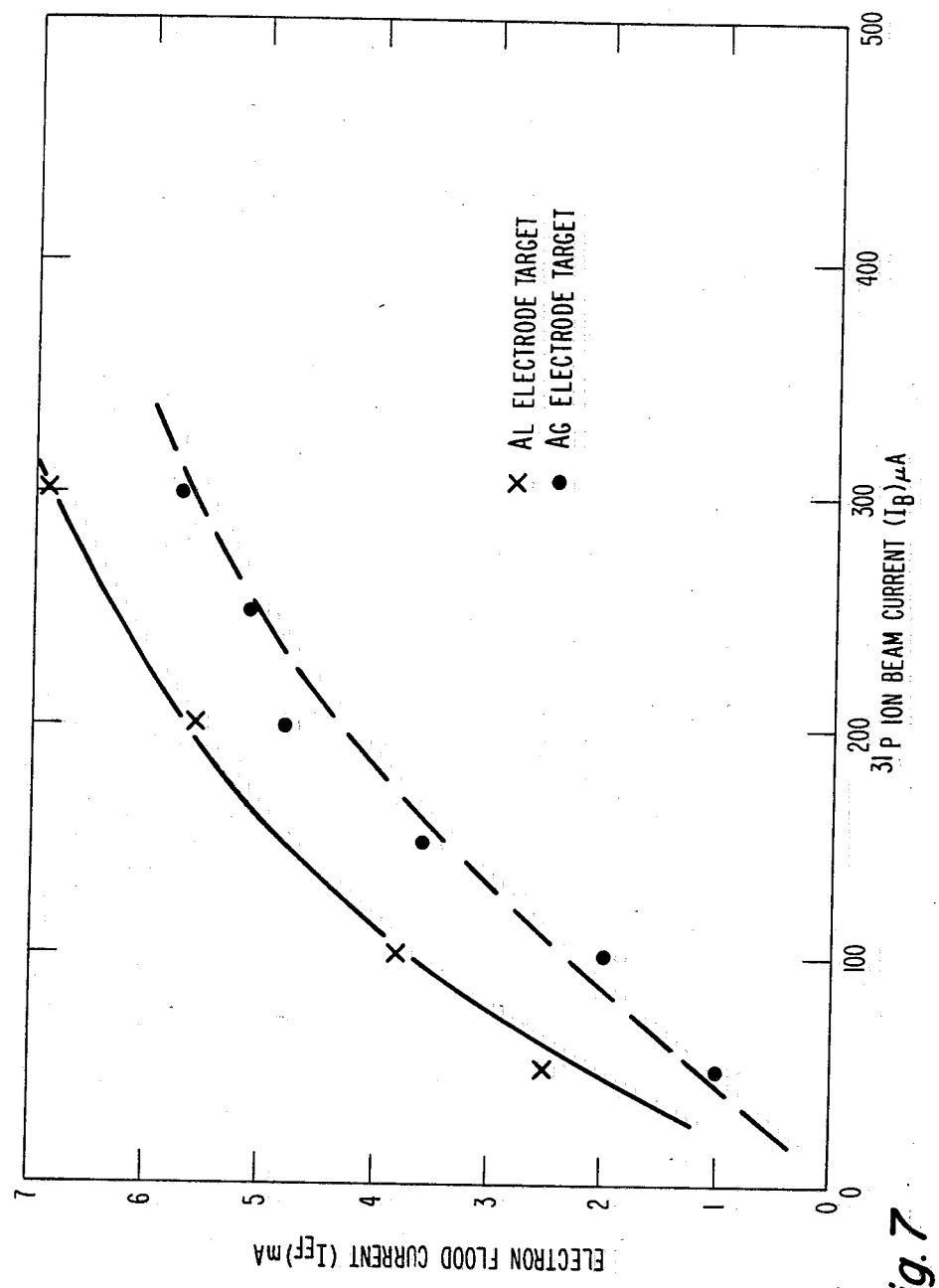
FIG. 7 shows curve plots of electron flood current ($I_{EF}$) as a function of ion current ($I_B$) for aluminum and silicon targets, respectively.

It should be noted that the data indicated by FIGS. 5 through 7 are only guidelines for determining the optimum electron flood emission currents needed to neutralize and then to further "over-neutralize" the beam during implantation. As long as adequate beam shape can be maintained, and as long as adequate beam size is maintained, overflooding by 10-20% of the current over the optimum values shown in the curves of FIGS. 5-7 is needed, rather than underflooding, to be assured of arcing prevention. Our experiments show that overflooding does not in fact cause negative charging of a target by more than 5-10 volts. This voltage value is roughly the mean energy of the secondary electrons scattered from the walls of the Faraday assembly 46.

Similar data can be derived for other ions such as boron, arsenic and the like, as desired, in the manner described above. For example, we found that flood currents 25 to 35 times the beam current at 100 microamperes for a boron ion beam was needed for complete neutralization and 20 to 30 times at 200 microamperes. Greater beam currents were impossible to obtain for the reasons explained above. For arsenic ion beams, the ratio was 40 to 50 at 100 microamperes and over 25 at 200 microamperes.

What is claimed is:

1. A method for calibrating an ion implanter apparatus for preventing arcing in insulated devices during ion implantation, said ion implanter apparatus having a Faraday cage, each of said devices having a surface or being formed on a surface that is an insulator comprising the steps of:
   (a) positioning an insulating test substrate on said apparatus in ion implant position, said substrate having one surface in exposure position to the ion beam
   (b) providing an electrode on a portion of said surface of said substrate;
   (c) irradiating said electrode and the remaining surface portion of said substrate with a beam of ions;
   (d) measuring the current of said beam to determine the dose of said ions on said electrode;
   (e) measuring the voltage on said electrode, said voltage being an indication of the charge on the electrode induced by the ion beam; and
   (f) flooding said ion beam in said Faraday cage with electron flood emission currents having a value greater than the current needed to neutralize the positive space-charge of said ion beam and sufficient to provide a slight negative charge on said electrode, by varying the electron flood emission current until the charge on said electrode is substantially zero indicating substantially complete neutralization of the ion space-charge;
   whereby said implanter is calibrated for subsequent use to implant said devices and to prevent arcing in said devices during ion implantation.

2. The method of claim 1 wherein said devices are formed of silicon and said implanter is calibrated for electron flooding of said silicon devices.

3. The method of claim 1 comprising the step of cooling said Faraday cage.

4. The method of claim 1 comprising the step of detuning the ion beam whereby the electron flood emission current requirement is reduced.

5. The method of claim 1 further comprising the step of providing an electron suppression ring at the entrance to said Faraday cage and biasing said ring with a negative voltage sufficient to suppress electrons from escaping from within said cage.

6. The method of claim 1 wherein said negative charge is about 10 to 15 volts.

7. In an implant apparatus of the type for providing an ion beam and having means for adjusting the current value of the beam and further having a Faraday cage, wherein the improvement comprises;
   an insulating substrate having a metallic electrode positioned on a portion of one surface of the substrate;
   means for positioning said substrate in the path of said beam to be implanted thereby with ions from said beam;
   means for measuring the voltage on said electrode, said voltage being an indication of the charge on said substrate induced by said beam;
   means for flooding said ion beam in said Faraday cage with electron flood emission currents having a value greater than the current needed to neutralize the positive space-charge of said ion beam and sufficient to provide a slight negative voltage on said electrode,
   means for varying the electron flood emission current until the charge on said electrode is substantially zero indicating substantially complete neutralization of the ion space-charge;
   whereby said implanter is calibrated for subsequent use to implant said devices and to prevent arcing in said devices during ion implantation.

* * * * *